(12) United States Patent
Yang

(10) Patent No.: US 8,531,200 B2
(45) Date of Patent: Sep. 10, 2013

(54) SEMICONDUCTOR DEVICE FOR PERFORMING TEST OPERATION AND METHOD THEREOF

(75) Inventor: Sun-Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 411 days.

(21) Appl. No.: 12/831,706

(22) Filed: Jul. 7, 2010

(65) Prior Publication Data

US 2011/0267091 A1    Nov. 3, 2011

(30) Foreign Application Priority Data

Apr. 30, 2010   (KR) .................. 10-2010-0040948

(51) Int. Cl.
*G01R 31/26*   (2006.01)
(52) U.S. Cl.
USPC .................................... 324/762.01

(58) Field of Classification Search
None
See application file for complete search history.

(56) References Cited

U.S. PATENT DOCUMENTS 5,107,208 A * 4/1992 Lee .............................. 714/733
5,260,950 A * 11/1993 Simpson et al. ............. 714/727
5,261,076 A * 11/1993 Shamshirian ................ 712/200
5,889,787 A * 3/1999 Cauchy ........................ 714/733

FOREIGN PATENT DOCUMENTS

JP    2003-185706    7/2003

OTHER PUBLICATIONS

Notice of Preliminary Rejection issued from Korean Intellectual Property Office on Aug. 12, 2011.

* cited by examiner

*Primary Examiner* — Vinh Nguyen
(74) *Attorney, Agent, or Firm* — IP & T Group LLP

(57) ABSTRACT

A semiconductor device includes an internal operation signal generation circuit configured to generate an internal operation signal in response to a signal applied through a reset signal input pad during a test period.

11 Claims, 3 Drawing Sheets

SEMICONDUCTOR DEVICE FOR PERFORMING TEST OPERATION AND METHOD THEREOF

CROSS-REFERENCE TO RELATED APPLICATIONS

The present application claims priority of Korean Patent Application No. 10-2010-0040948, filed on Apr. 30, 2010, which is incorporated herein by reference in its entirety.

BACKGROUND OF THE INVENTION

Exemplary embodiments of the present invention relate to a semiconductor design technology, and more particularly, to a wafer test operation of a semiconductor device.

As is well known, some tests may be performed in mass production or R&D (research and development) of semiconductor devices such as a dynamic random access memory (DRAM). Such tests include a product test, which is performed by detecting defects in fabrication processes such as a wafer process or assembly process to remove failed products, and a verification test, which verifies whether the semiconductor devices work normally in accordance with the design specification.

After the semiconductor device is fabricated, a test may be performed to determine pass/fail with respect to all cells of the semiconductor device. Cells which can be repaired among the failed cells are repaired, and the cells which cannot be repaired are discarded.

Such a test includes a screening test which sorts out failed DRAMs at a wafer level of the semiconductor devices.

In general, the screening test detects fail of semiconductor devices by performing a probing test using a probe at a wafer level in the course of the production of semiconductor devices.

In the probing test, a plurality of semiconductor devices existing on a wafer may be tested at the same time.

A channel refers to the minimum number of input/output pins necessary for testing the respective semiconductor devices existing on the wafer. If the number of channels per the semiconductor device existing on the wafer increases, the number of probes necessary for the wafer test increases. Thus, the number of semiconductor devices testable at a time decreases, and time necessary for the screening test increases.

On the other hand, if the number of channels per the semiconductor device existing on the wafer decreases, the number of probes used for the wafer test decreases. Thus, the number of semiconductor devices testable at a time increases, and time necessary for the screening test decreases.

Therefore, since a small number of channels per the semiconductor device exist on the wafer, an efficiency of screening test may increase.

FIG. 1 is a block diagram illustrating a usage of a reset signal input pad in a known semiconductor device.

Referring to FIG. 1, a semiconductor device buffers a signal EXT_RESET applied through a reset signal input pad RESET_PAD, and generates an internal reset signal INT_RESETB.

That is, the signal EXT_RESET applied through the reset signal input pad RESET_PAD is used for the purpose of generating the internal reset signal INT_RESETB.

Since it is difficult to predict when to reset the semiconductor device in a normal operation, it is apparent that the signal EXT_RESET applied through the reset signal input pad RESET_PAD is used only for the purpose of generating the internal reset signal INT_RESETB.

However, when the screening test is performed on the semiconductor device at the wafer level, the semiconductor device need not be reset any more if the semiconductor device is reset once in the early test operation.

Therefore, in the screening test of the semiconductor device at the wafer level, if the internal reset signal INT_RESETB is activated in the early test operation and resets the semiconductor device, a deactivated state is maintained.

According to the semiconductor device of FIG. 1, however, when the screening test is performed on the semiconductor device at the wafer level, even though the operation of changing the logic level of the internal reset signal INT_RESET by using the signal EXT_RESET applied through the reset signal input pad RESET_PAD is performed only in the early test operation, since the reset signal input pad RESET_PAD is used only for the purpose of generating the internal reset signal INT_RESETB, inefficiency follows.

Although it may be a small loss with respect to an individual semiconductor device, it is not a small loss in that a large number of semiconductor devices are tested at a time in the screening test at the wafer level.

SUMMARY OF THE INVENTION

An embodiment of the present invention is directed to a circuit and method in which, when a semiconductor device is tested at a wafer level, a signal applied through a reset signal input pad can be used for multiple purposes.

In accordance with an exemplary embodiment of the present invention, a semiconductor device includes an internal operation signal generation circuit configured to generate an internal operation signal in response to a signal applied through a reset signal input pad during a test period.

In accordance with another exemplary embodiment of the present invention, a semiconductor device includes an internal reset signal generation circuit configured to generate an internal reset signal in response to an external reset signal applied through a reset signal input pad during a deactivation period of a test enable signal, and an internal operation signal generation circuit configured to generate an internal operation signal in response to the signal applied through the reset signal input pad and a test enable signal.

In accordance with yet another exemplary embodiment of the present invention, a method for operating a semiconductor device includes generating an internal reset signal having a deactivated state before an activation period of the test enable signal by using a signal applied through a reset signal input pad, and generating an internal operation signal in response to the signal applied through the reset signal input pad and the test enable signal.

DESCRIPTION OF SPECIFIC EMBODIMENTS

Figure 1:
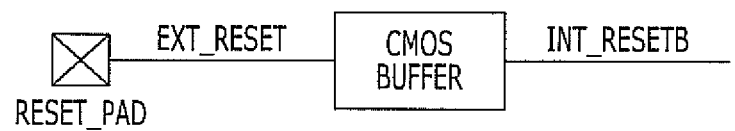
FIG. 1 is a block diagram illustrating the usage of a reset signal input pad in a known semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
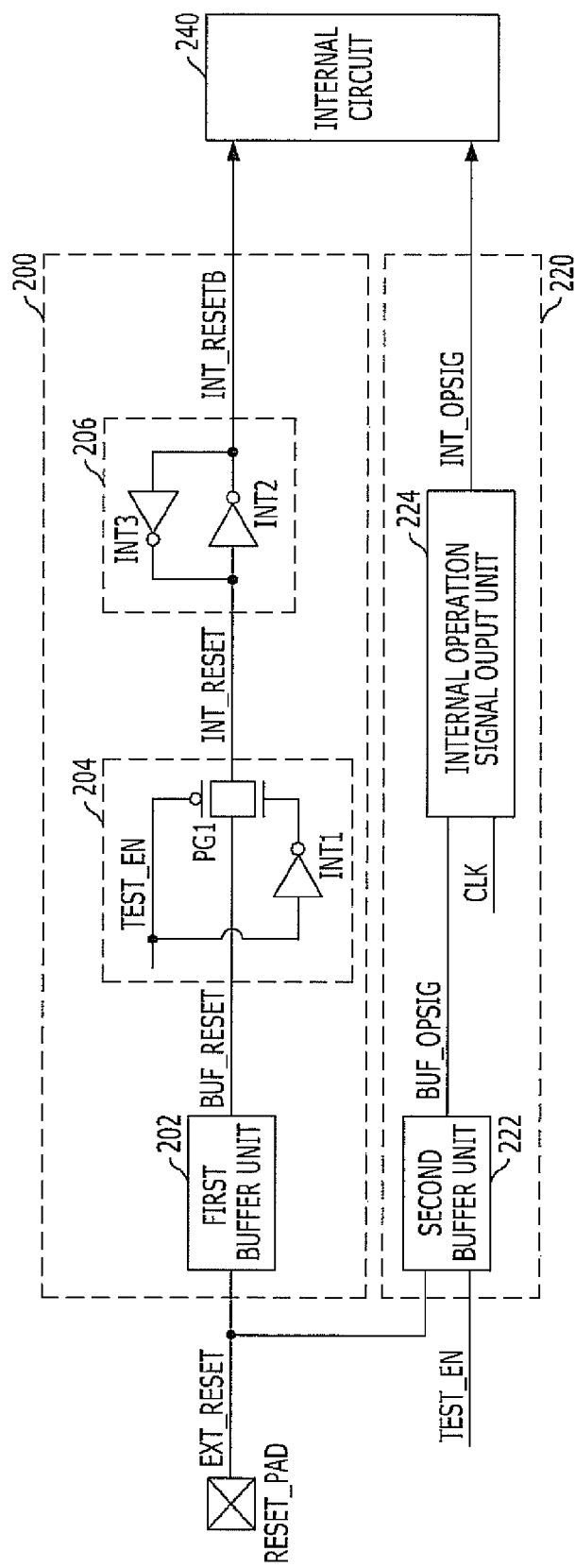
FIG. 2 is a block diagram illustrating the usage of a reset signal input pad in a semiconductor device in accordance with an exemplary embodiment of the present invention.

FIG. 2 is a block diagram illustrating the usage of a reset signal input pad in a semiconductor device in accordance with an exemplary embodiment of the present invention.

Referring to FIG. 2, the semiconductor device in accordance with the exemplary embodiment of the present invention includes an internal reset signal generation circuit 200 and an internal operation signal generation circuit 220. The internal reset signal generation circuit 200 is configured to generate an internal reset signal INT_RESETB in response to a signal EXT_RESET applied through a reset signal input pad RESET_PAD. Specifically, the internal reset signal generation circuit 200 is configured to fix a logic level of the internal reset signal INT_RESETB in response to a test enable signal TEST_EN. The internal operation signal generation circuit 220 is configured to receive the signal EXT_RESET applied through the reset signal input pad RESET_PAD according to the test enable signal TEST_EN, and generate an internal operation signal INT_OPSIG. Also, the semiconductor device further includes an internal circuit 240 configured to perform an internal operation in response to the internal operation signal INT_OPSIG, and to be initialized in response to the internal reset signal INT_RESETB.

According to an example, the internal reset signal generation circuit 200 includes a first buffer unit 202, a selective transfer unit 204, and a latch unit 206. The first buffer unit 202 is configured to buffer the signal EXT_RESET applied through the reset signal input pad RESET_PAD, and output a buffered internal reset signal BUF_RESET. The selective transfer unit 204 is configured to selectively transfer the buffered internal reset signal BUF_RESET outputted from the first buffer unit 202 to the internal circuit 240 in response to the test enable signal TEST_EN. The latch unit 206 is coupled between an output terminal of the selective transfer unit 204 and an input terminal of the internal circuit 240, and configured to latch a logic level of the internal reset signal INT_RESETB.

The selective transfer unit 204 may include an inverter INT1 and a pass gate PG1. The inverter INT1 is configured to invert the test enable signal TEST_EN. The pass gate PG1 is configured to output the output signal BUF_RESET as the internal reset signal INT_RESETB in response to the test enable signal TEST_EN.

The latch unit 206 includes a first inverter INT2 and a second inverter INT3. The first inverter INT2 is configured to invert the signal INT_RESET outputted from the selective transfer unit 204, and output the internal reset signal INT_RESETB.

In a period in which the test enable signal TEST_EN is deactivated to a logic low level, the internal reset signal generation circuit 200 having the above-described configuration output the internal reset signal INT_RESETB in response to the signal EXT_RESET applied through the reset signal input pad RESET_PAD. On the other hand, in a period in which the test enable signal TEST_EN is activated to a logic high level, the internal reset signal generation circuit 200 maintains the logic level of the internal reset signal BUF_RESETB which is determined when the test enable signal TEST_EN is deactivated to a logic low level, regardless of the logic level of the signal EXT_RESET applied through the reset signal input pad RESET_PAD.

According to an example, the internal operation signal generation circuit 220 includes a second buffer unit 222 and an internal operation signal output unit 224. The second buffer unit 222 is configured to selectively buffer the signal EXT_RESET applied through the reset signal input pad RESET_PAD according to the test enable signal TEST_EN. The internal operation signal output unit 224 is configured to output the internal operation signal INT_OPSIG corresponding to the signal BUF_OPSIG outputted from the second buffer 222.

In a period in which the test enable signal TEST_EN is activated to a logic high level, the internal operation signal generation circuit 220 having the above-described configuration receives the signal EXT_RESET applied through the reset signal input pad RESET_PAD, and generates the internal operation signal INT_OPSIG. In this period, the signal EXT_RESET is a signal for a screening test and not a reset signal. On the other hand, in a period in which the test enable signal TEST_EN is deactivated to a logic low level, the internal operation signal generation circuit 220, for example, does not receive the signal EXT_RESET applied through the reset signal input pad RESET_PAD and the internal operation signal INT_OPSIG is not activated.

Figure 3:
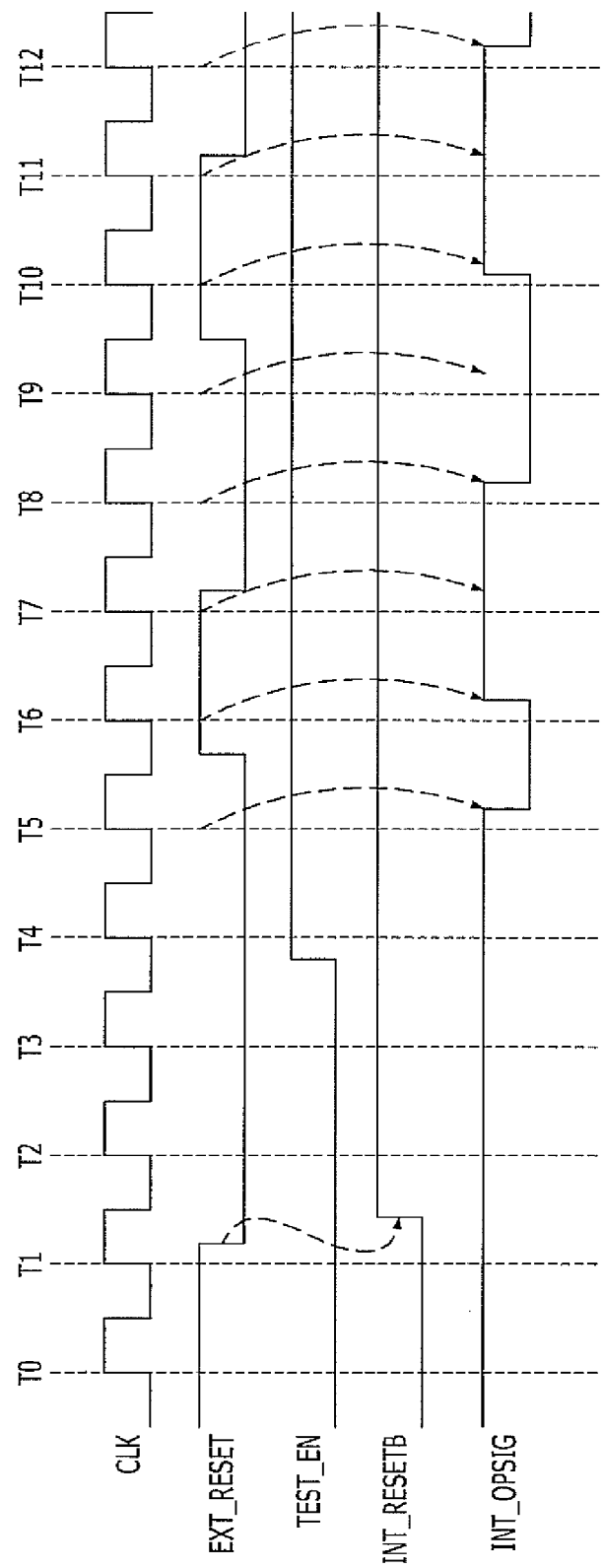
FIG. 3 is a timing diagram showing the operation of the semiconductor device of FIG. 2 in accordance with the exemplary embodiment of the present invention.

FIG. 3 is a timing diagram explaining the operation of the semiconductor device in accordance with the exemplary embodiment of the present invention.

Referring to FIG. 3, the semiconductor device in accordance with the exemplary embodiment of the present invention generates the internal operation signal INT_OPSIG in response to the signal EXT_RESET, for example the signal for a screening test, applied through the reset signal input pad RESET_PAD in test periods T4, T5, T6, T7, T8, T9, T10, T11 and T12 corresponding to the test enable signal TEST_EN, and generates the internal reset signal INT_RESETB in response to the signal EXT_RESET applied through the reset signal input pad RESET_PAD in non-test periods T0, T1, T2 and T3. Here, it is presumed that the periods T0, T1, T2 and T3 are initially set periods for preparing an actual test operation.

Specifically, after the period T0 in which the semiconductor device enters the wafer test operation mode, the test enable signal TEST_IN is deactivated to a logic low level during the initially set periods T0, T1, T2 and T3.

Therefore, the logic level of the internal reset signal INT_RESETB is changed according to the signal EXT_RESET applied through the reset signal input pad RESET_PAD during the initially set periods T0, T1, T2 and T3.

At this time, according to an example, during periods T0 and T1 among the initially set periods T0, T1, T2 and T3, the signal EXT_RESET applied through the reset signal input pad RESET_PAD is changed to a logic high level and thus the internal reset signal INT_RESETB is activated to a logic low level. Then, during the periods T2 and T3 among the initially set periods T0, T1, T2 and T3, the signal EXT_RESET applied through the reset signal input pad RESET_PAD is changed to a logic low level and thus the internal reset signal INT_RESETB is deactivated to a logic high level.

When the internal reset signal INT_RESETB is activated to a logic low level according to the signal EXT_RESET applied through the reset signal input pad RESET_PAD during the periods T0 and T1, the operation of the internal circuit 240 is reset in response to the internal reset signal INT_RESETB.

Then, when the internal reset signal INT_RESETB is deactivated to a logic high level according to the signal EXT_RESET applied through the reset signal input pad RESET_PAD during the periods T2 and T3, the reset operation of the internal circuit 240 is not performed.

On the other hand, the value of the internal operation signal INT_OPSIG is stable at a disabled state and is not changed although the signal EXT_RESET is applied through the reset signal input pad RESET_PAD during the initially set periods T0, T1, T2 and T3.

Here, that the value of the internal operation signal INT_OPSIG is in the disabled state means that the internal circuit 240 is not involved in an operation of the internal circuit 240. Although the specific level is a logic high level in FIG. 3, it may also be a logic low level.

In the periods T4, T5, T6, T7, T8, T9, T10, T11 and T12 after the initially set periods T0, T1, T2 and T3, according to an example, the test enable signal TEST_EN is activated to a logic high level.

Therefore, in the periods T4, T5, T6, T7, T8, T9, T10, T11 and T12 after the initially set periods T0, T1, T2 and T3, the logic level of the internal reset signal INT_RESETB is stable even though the logic level of the signal EXT_RESET applied through the reset signal input pad RESET_PAD is changed.

At this time, the logic level of the internal reset signal INT_RESETB determined when a time period changes from the initially set periods T0, T1, T2 and T3 to the periods T4, T5, T6, T7, T8, T9, T10, T11 and T12 is maintained during the periods T4, T5, T6, T7, T8, T9, T10, T11 and T12. That is, the internal reset signal INT_RESETB which has been at a logic high level when a time period changes from the initially set periods T0, T1, T2 and T3 to the periods T4, T5, T6, T7, T8, T9, T10, T11 and T12 is maintained at a logic high level during the periods T4, T5, T6, T7, T8, T9, T10, T11 and T12, regardless of the change in the logic level of the signal EXT_RESET applied through the reset signal input pad RESET_PAD.

On the other hand, in the periods T4, T5, T6, T7, T8, T9, T10, T11 and T12 after the initially set periods T0, T1, T2 and T3, the value of the internal operation signal INT_OPSIG is changed according to the signal EXT_RESET, for example the signal for a screening test, applied through the reset signal input pad RESET_PAD.

That is, in the periods T4, T5, T6, T7, T8, T9, T10, T11 and T12 after the initially set periods T0, T1, T2 and T3, when the signal EXT_RESET applied through the reset signal input pad RESET_PAD becomes a logic high level, the internal operation signal INT_OPSIG also becomes a logic high level in response to the signal EXT_RESET. When the signal EXT_RESET applied through the reset signal input pad RESET_PAD becomes a logic low level, the internal operation signal INT_OPSIG also becomes a logic low level in response to the signal EXT_RESET.

Therefore, in the periods T4, T5, T6, T7, T8, T9, T10, T11 and T12 after the initially set periods T0, T1, T2 and T3, the internal operation signal INT_OPSIG can be involved in the operation of the internal circuit 240.

FIGS. 2 and 3 illustrate that the internal operation signal INT_OPSIG is generated in response to the clock CLK and the signal EXT_RESET applied through the reset signal input pad RESET_PAD. This is because it is assumed that the exemplary internal operation signal INT_OPSIG is used as an address signal or a data signal in the internal circuit 240, that is, the internal operation signal INT_OPSIG is a signal synchronized with the clock CLK. In the embodiments of the present invention, the operation synchronized with the clock CLK is not always necessary.

When the internal operation signal INT_OPSIG is used as the address signal or the data signal in the internal circuit 240, the internal operation signal INT_OPSIG is a signal which can be represented by 1 bit. Thus, the internal operation signal INT_OPSIG may be a signal which represents any one bit of the multi-bit address signal or the multi-bit data signal.

As described above, when the semiconductor device is tested at the wafer level, the signal EXT_RESET applied through the reset signal input pad RESET_PAD can be used to generate the internal reset signal INT_RESETB during, according to the example, only the initially set periods, and used to generate the internal operation signal INT_OPSIG in the periods after the initially set periods. Therefore, the channel number of the semiconductor device used in the test operation can be reduced.

Hence, a time necessary to test the semiconductor device at the wafer level may decrease.

While the present invention has been described with respect to the specific embodiments, it will be apparent to those skilled in the art that various changes and modifications may be made without departing from the spirit and scope of the invention as defined in the following claims.

For example, the positions and type of the logic gates and the transistors set forth above may be differently implemented according to the polarities of the input signals.

What is claimed is:
1. A semiconductor device comprising:
an internal reset signal generation circuit configured to generate an internal reset signal in response to a signal supplied through a reset signal input pad during a deactivation period of a test enable signal; and
an internal operation signal generation circuit configured to receive the signal supplied through the reset signal input pad in response to the test enable signal and to generate an internal operation signal in response to the signal and the test enable signal,
wherein the internal reset signal generation circuit maintains a logic level of the internal reset signal determined during an activation period of the test enable signal regardless of the signal supplied through the reset signal input pad.

2. The semiconductor device of claim 1, further comprising an internal circuit configured to perform an internal operation in response to the internal operation signal during an activation period of the test enable signal, and to be initialized in response to the internal reset signal in the deactivation period of the test enable signal.

3. The semiconductor device of claim 1, wherein the internal operation signal generation circuit is configured to generate the internal operation signal in response to the signal applied through the reset signal input pad in the activation period of the test enable signal, and not to generate internal operation signal during the deactivation period of the test enable signal.

4. The semiconductor device of claim 1, wherein the internal reset signal generation circuit comprises a latch unit configured to fix a logic level of the internal reset signal at a level not to reset an internal circuit during the activation period of the test enable signal.

5. The semiconductor device of claim 1, wherein the internal reset signal generation circuit comprises:
a first buffer unit configured to buffer the signal applied through the reset signal input pad;
a selective transfer unit configured to selectively transfer an output signal of the first buffer to the internal circuit in response to the test enable signal; and a latch unit coupled between the selective transfer unit and an internal circuit.

6. The semiconductor device of claim 5, wherein the internal operation signal generation circuit comprises:
   a second buffer unit configured to selectively buffer the signal applied through the reset signal input pad in response to the test enable signal; and
   an internal operation signal output unit configured to output the internal operation signal in response to an output signal of the second buffer unit.

7. The semiconductor device of claim 1, wherein the test enable signal maintains a deactivated state during an initial period among wafer test operation periods.

8. The semiconductor device of claim 7, wherein the internal reset signal is activated for a first time period during the initial period, and set to a deactivated state during an activation period of the test enable signal.

9. The semiconductor device of claim 1, wherein the internal operation signal includes an address signal.

10. The semiconductor device of claim 1, wherein the internal operation signal includes a data signal.

11. A method for operating a semiconductor device, comprising:
   generating an internal reset signal having a deactivated state before an activation period of a test enable signal by using a signal supplied through a reset signal input pad; and
   generating an internal operation signal in response to the signal applied through the reset signal input pad and the test enable signal,
   wherein the generating of an internal reset signal having a deactivated state comprises:
   activating the internal reset signal for a first time period; and
   deactivating the internal reset signal during the activation period of the test enable signal.

* * * * *